(12) United States Patent
Liu et al.

(10) Patent No.: US 12,142,311 B2
(45) Date of Patent: Nov. 12, 2024

(54) PMOS THRESHOLD COMPENSATION SENSE AMPLIFIER FOR FeRAM DEVICES

(71) Applicant: Micron Technology, Inc., Boise, ID (US)

(72) Inventors: Tong Liu, Folsom, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 17/829,046

(22) Filed: May 31, 2022

(65) Prior Publication Data

US 2023/0386545 A1 Nov. 30, 2023

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC .............. G11C 11/2273; G11C 11/221; G11C 11/2275
See application file for complete search history.

(56) References Cited

U.S. PATENT DOCUMENTS

| | | | | |
|---|---|---|---|---|
| 7,443,708 B2 * | 10/2008 | Madan | ..................... | G11C 11/22 365/230.03 |
| 10,839,873 B1 * | 11/2020 | Lee | ..................... | G11C 7/1048 |
| 2003/0026122 A1 * | 2/2003 | Nair | ......................... | G11C 11/22 365/145 |
| 2004/0047172 A1 * | 3/2004 | Komatsuzaki | .......... | G11C 11/22 365/145 |
| 2020/0257331 A1 * | 8/2020 | Asaki | ........................ | G06F 1/08 |
| 2021/0020210 A1 * | 1/2021 | Lee | ......................... | G11C 7/062 |
| 2022/0013152 A1 * | 1/2022 | Cao | ......................... | G11C 7/12 |

FOREIGN PATENT DOCUMENTS

WO WO-2022032967 A1 * 2/2022 ......... G11C 11/4091

OTHER PUBLICATIONS

WO-2022032967-A1 Translation (Year: 2024).*

* cited by examiner

*Primary Examiner* — Khamdan N. Alrobaie
(74) *Attorney, Agent, or Firm* — Fletcher Yoder, P.C.

(57) ABSTRACT

Systems and methods are related to a memory device including a plate line. The memory device also includes a pair of ferroelectric layers implementing a pair of memory cells and coupled to opposite sides of the plate line. The memory device further includes a pair of digit lines each coupled to a respective ferroelectric layer of the pair of ferroelectric layers. The memory device also includes a sense amplifier coupled to the pair of digit lines and configured to sense and amplify voltages received at the digit lines from the respective memory cells. The sense amplifier includes a threshold voltage compensated latch that includes multiple p-channel transistors and is configured to compensate for process, voltage, or temperature variation mismatches between the threshold voltages of the multiple p-channel transistors.

20 Claims, 6 Drawing Sheets

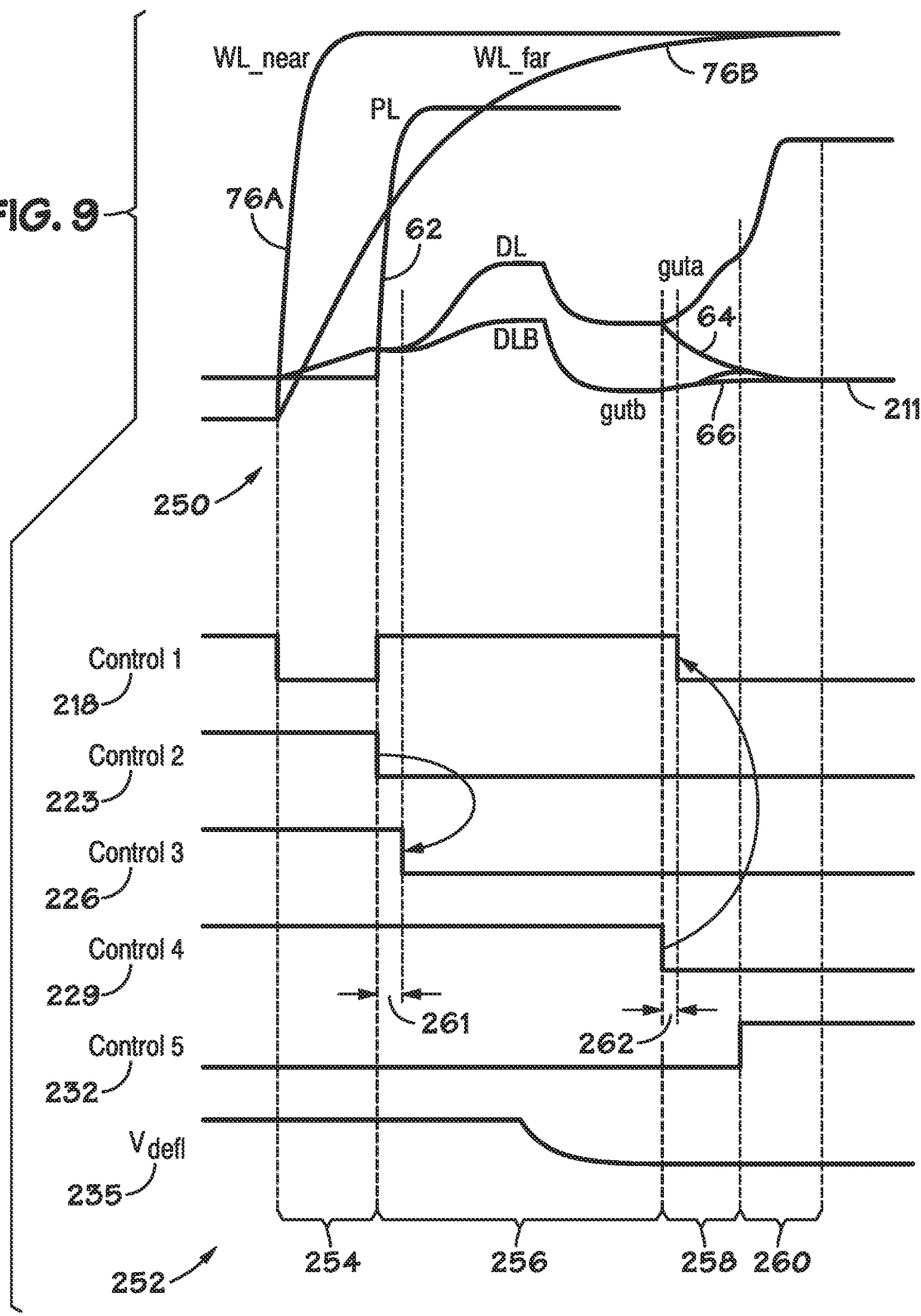

US 12,142,311 B2

PMOS THRESHOLD COMPENSATION SENSE AMPLIFIER FOR FeRAM DEVICES

BACKGROUND

Field of the Present Disclosure

Embodiments of the present disclosure relate generally to memory devices. More specifically, embodiments of the present disclosure relate to monitoring operation of a memory device.

Description of Related Art

Generally, a computing system may include electronic devices that, in operation, communicate information via electrical signals. For example, a computing system may include a processor communicatively coupled to a memory device, such as a dynamic random-access memory (DRAM) device, a ferroelectric random-access memory (FeRAM) device, another random-access memory (RAM) device, and/or a hybrid device that incorporates more than one type of RAM. In this manner, the processor may communicate with the memory device, for example, to retrieve executable instructions, retrieve data to be processed, by the processor, and/or store data output from the processor.

The memory devices utilize sense amplifiers used by the memory device during read operations. Specifically, the read circuitry of the memory device utilizes the sense amplifiers to receive low voltage (e.g., low differential) signals and amplify the small voltage (e.g., voltage differences) to enable the memory device to interpret the data properly. However, some embodiments of the sense amplifiers consume excess resources (e.g., power and/or area). Furthermore, some sense amplifiers have to perform operations within specified timing restraints that may be more difficult to meet for some technologies (e.g., FeRAM) without adjustments to current operation.

Embodiments of the present disclosure may be directed to one or more of the problems set forth above.

BRIEF DESCRIPTION OF THE DRAWINGS

FIG. 9 is a graph and timing diagram of operation of the sense amplifier of FIG. 8, according to an embodiment of the present disclosure.

DETAILED DESCRIPTION

Figure 1:
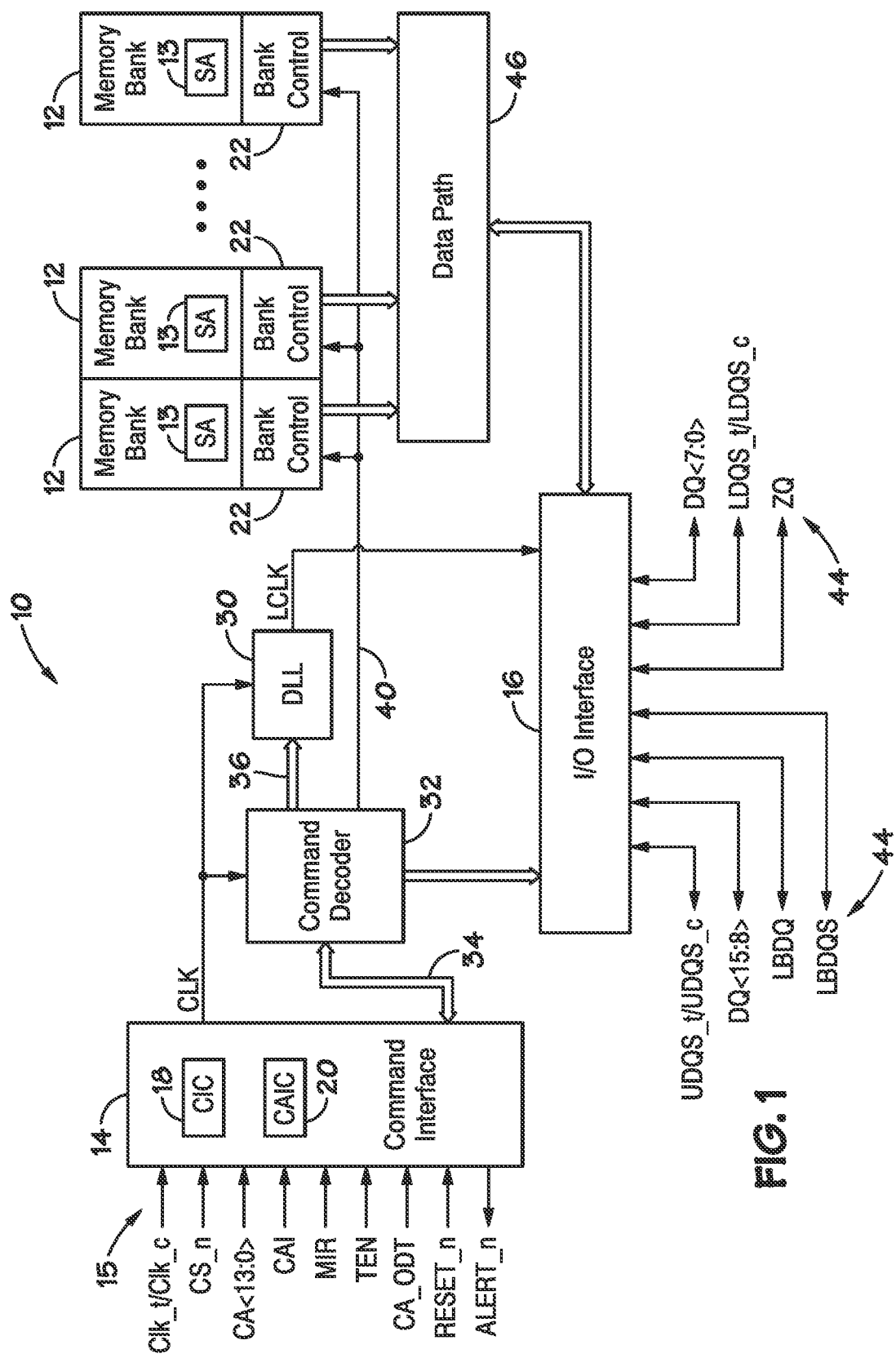
FIG. 1 is a simplified block diagram illustrating certain features of a memory device having sense amplifiers and memory cells, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, and/or store data output from the processor.

FeRAM memory technology utilization is increasing due to various possible market directions. As discussed, below FeRAM may be implemented with one-transistor, one-capacitor (1T1C) per cell or two-transistor, two-capacitor (2T2C) per cell arrangements. In the 2T2C arrangement, two cells are used for a single bit of data. One cell stores the data while another cell stores the complement of the data. The first cell is coupled to a digit line (DL) while the second is coupled to a digit line bar/false (DLB). A sense amplifier receives both signals from the DL and the DLB as a differential signal.

As discussed below, the 1T1C arrangement understandably uses less space than the 2T2C arrangement. However, the 2T2C accommodates faster speeds that may be used to obtain performances close or the same as DRAM specification requirements to enable the FeRAM to be compliant with DRAM specifications in dedicated FeRAM devices or hybrid DRAM/FeRAM devices. Thus, timing of various FeRAM operations may be important to comply with DRAM specified timings.

Furthermore, like DRAM, FeRAM utilizes a memory restore to restore memory values from latches back to the memory cells after a read. Specifically, each cell is programmed "0" and then cells that previously stored a "1" are programmed as such from the latches. Such programming of 1s may be conducted after writes are completed and may consume important time that is to be streamlined to comply with DRAM requirements.

Additionally, the differential signals from the DL and DLB to the sense amplifier may be relatively small (e.g., 50 mV-150 mV). Furthermore, due to the transistors used in the 2T2C or 1T1C arrangements, the operating voltage of the sense amplifier may be capped at a low level (e.g., 1.2 V). However, the voltage (e.g., 1.5V) to be written back to the DL/DLB may be higher than this low level. To address this difference, the sense amplifier may include write back circuitry to boost the output to the DL/DLB voltage level.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device, a ferroelectric memory (FeRAM) device, or a hybrid combination thereof. Various features of memory device 10 allow for reduced power consumption, more bandwidth and more storage capacity compared to prior generations of DDR SDRAM.

The memory device 10 may include a number of memory banks 12. The memory banks 12 may be DDR5 SDRAM memory banks, FeRAM memory banks, or both, for instance. The memory banks 12 may be provided on one or more chips (e.g., SDRAM and FeRAM chips) that are arranged on dual inline memory modules (DIMMS). Each DIMM may include a number of memory chips (e.g., ×8 or ×16 memory chips), as will be appreciated. Each memory chip may include one or more memory banks 12. The memory device 10 represents a portion of a single memory chip having a number of memory banks 12. The memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory banks 12 and/or bank control blocks 22 include sense amplifiers 13. As previously noted, sense amplifiers 13 are used by the memory device 10 during read operations. Specifically, read circuitry of the memory device 10 utilizes the sense amplifiers 13 to receive low voltage (e.g., low differential) signals from the memory cells of the memory banks 12 and amplifies the small voltage differences to enable the memory device 10 to interpret the data properly The memory device 10 may include a command interface 14 and an input/output (I/O) interface 16. The command interface 14 is configured to provide a number of signals (e.g., signals 15) from an external (e.g., host) device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, the true clock signal Clk_t and the bar clock signal Clk_c. The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 18 receives the true clock signal Clk_t and the bar clock signal Clk_c and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance and is used as a timing signal for determining an output timing of read data. In some embodiments, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes the bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/ address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20, which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a ×16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback data signal (LBDQ) and loopback strobe signal (LBDQS) may be provided to the memory device 10 through the IO interface 16. The loopback data signal and the loopback strobe signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both LBDQ and LBDQS or possibly just a loopback data pin. This is generally intended to be used to monitor the data captured by the memory device 10 at the IO interface 16. LBDQ may be indicative of a target memory device, such as memory device 10, data operation and, thus, may be analyzed to monitor (e.g., debug and/or perform diagnostics on) data operation of the target memory device. Additionally, LBDQS may be indicative of a target memory device, such as memory device 10, strobe operation (e.g., clocking of data operation) and, thus, may be analyzed to monitor (e.g., debug and/or perform diagnostics on) strobe operation of the target memory device.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
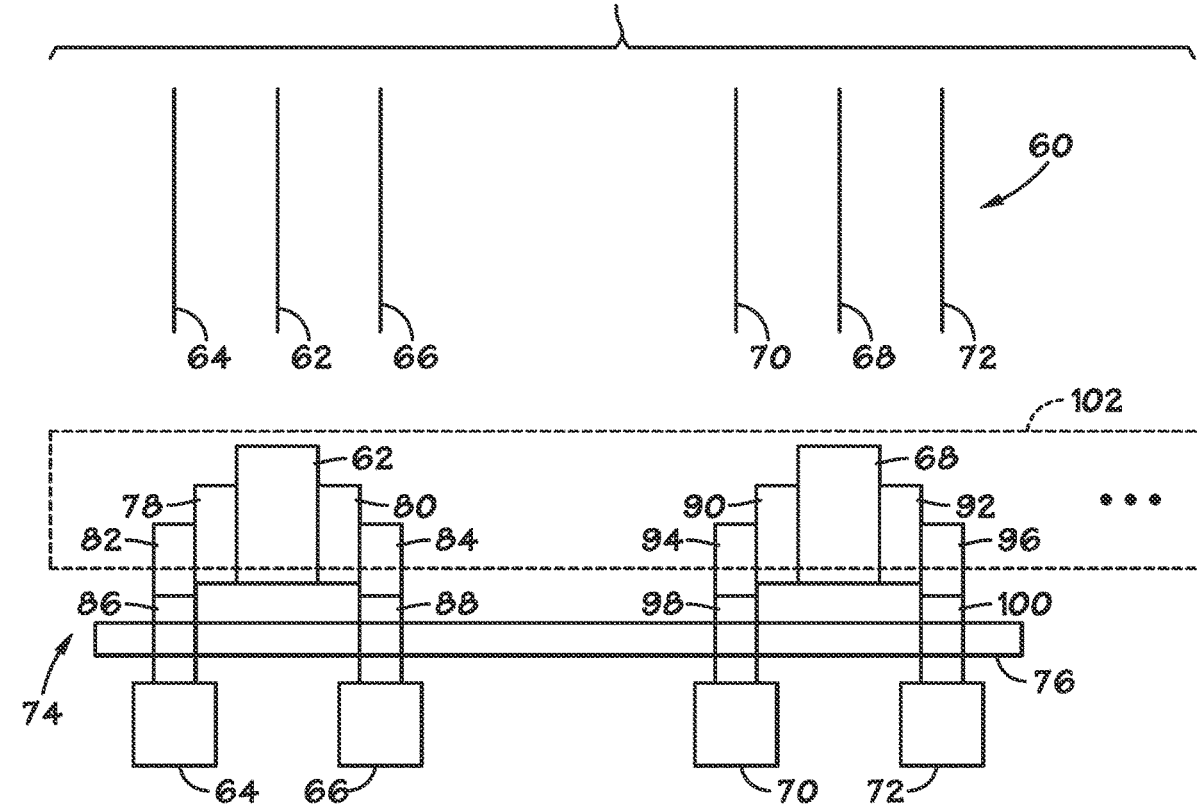
FIG. 2 is a top view of lines of ferroelectric memory cells of FIG. 1 and a side view of the lines in the memory cells of FIG. 1, according to an embodiment of the present disclosure.

FIG. 2 is a top view 60 of lines of ferroelectric memory cells of FIG. 1 and a side view 74 of the lines in the memory cells of FIG. 1 with additional connections. As illustrated, a ferroelectric memory device (e.g., memory device 10) may utilize a plate line (PL) 62 that provides a plate voltage to multiple cells in a row/column. Each PL is flanked by two digit lines that are utilized for cells connected to the respective PL. For instance, the PL 62 is flanked by DL 64 and DLB 66 at each cell in along the PL 62. Similarly, other plate lines may be used for other cells in other rows/columns. For instance, PL 68 may be flanked by DL 70 and DLB 72.

In the side view 74, the PLs 62 and 68 utilize a wordline (WL) 76 to control access to respective cells. As illustrated, the PL 62 is sandwiched between ferroelectric layers 78 and 80. The ferroelectric layers 78 and 80 are adjacent to opposite sides of the PL 62. For instance, the ferroelectric layers 78 and 80 may be formed from ferroelectric oxides, lead zirconium titanate, and/or other materials that have ferroelectric properties. Opposite the sides of the ferroelectric layers 78 and 80 coupled to and adjacent to the PL 62, the ferroelectric layers 78 and 80 are coupled to conductors 82 and 84 that may be extensions of source or drain terminals of respective selectors 86 and 88. The selectors 86 and 88 may be transistors. Instead, as discussed below, a write back circuit that works with higher voltages may be used to write back to the DL 64 and/or the DLB 66. The ferroelectric layer 78 connected to the PL 62 and the conductor 82 form a first cell while the ferroelectric layer 80 connected to the PL 62 and the conductor 84 form a second cell. The selectors 86 and 88 select the respective cells using the WL 76.

Similarly, the PL 68 is sandwiched between ferroelectric layers 90 and 92 with the ferroelectric layers 90 and 92 adjacent to opposite sides of the PL 68. Like the ferroelectric layers 78 and 80, the ferroelectric layers 90 and 92 may be formed from ferroelectric oxides, lead zirconium titanate, and/or other materials that have ferroelectric properties. Opposite the sides of the ferroelectric layers 90 and 92 coupled to and adjacent to the PL 68, the ferroelectric layers 90 and 92 are coupled to conductors 94 and 96 that may be extensions of source or drain terminals of respective selectors 98 and 100. The selectors 98 and 100 may be of the same type, materials, and/or characteristics as the selectors 86 and 88. The ferroelectric layer 90 connected to the PL 68 and the conductor 94 form a first cell while the ferroelectric layer 92 connected to the PL 68 and the conductor 96 form a second cell. The selectors 98 and 100 select the respective cells using the WL 76.

Although the foregoing discusses using a PL for the cells. However, in some embodiments, at least two of the PLs (e.g., PL 62 and 68) may be merged into a single plate 102 shared between at least 4 digit lines (e.g., DL 64, DLB 66, DL 70, and DLB 72).

Figure 3:
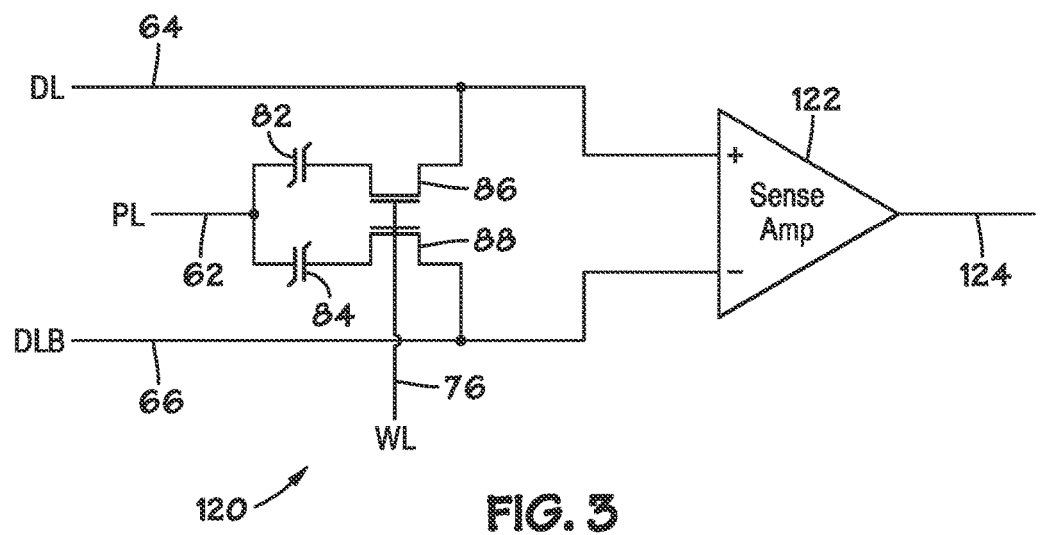
FIG. 3 is a circuit diagram of a connection of the lines of FIG. 2 to a sense amplifier of FIG. 3, according to an embodiment of the present disclosure.

FIG. 3 is a circuit diagram of a connection 120 of the PL 62 through ferroelectric layers 78 and 80 via selectors 86 and 88 to the DL 64 and the DLB 66, respectively. The DL 64 and the DLB 66 are received at a sense amplifier 122 as a differential signal. The sense amplifier 122 may be one of the sense amplifiers 13 of FIG. 1. The sense amplifier 122 utilizes this differential signal to output a value 124. In some embodiments, the sense amplifier 122 may also send a complementary value along with the value 124.

Figure 4:
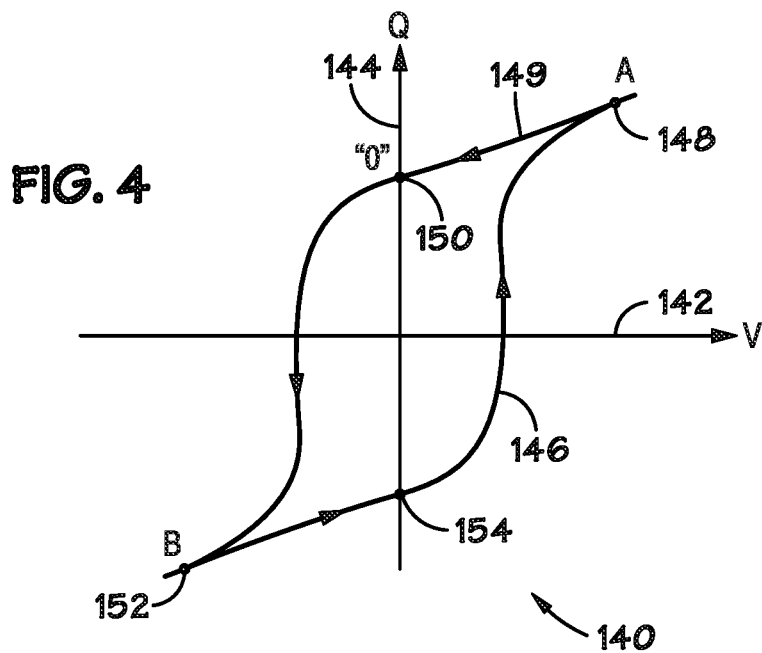
FIG. 4 is a graph of a ferroelectric characteristic of the memory cell of FIGS. 2 and 3, according to an embodiment of the present disclosure.

FIG. 4 is a graph 140 of a ferroelectric characteristic of the ferroelectric layers 78, 80, 90, and 92. The graph 140 plots the voltage (V) 142 applied across the ferroelectric layer/capacitor and the charge (Q) 144 in the ferroelectric layer/capacitor. The voltage is increased in a positive direction across the ferroelectric layer/capacitor along line 146 until a point A 148 is reached. After the point A 148 is reached, when the voltage is removed (e.g., returns to 0V), the charge decreases along line 149 until it settles at a point 150 that is deemed a first logic value (e.g., "0"). If the voltage across the ferroelectric layer/capacitor is made more negative, the charge continues decreasing along line 149 until a point B 152 is reached. After the point B 152 has been reached, a removal or increase of the voltage causes the charge to increase again along the line 146. If the voltage is removed (e.g., 0V), the charge settles to a point 154 that is deemed a second logic value (e.g., "1"). Although the illustrated logic values have inverse relationships with the amount of charge in the ferroelectric layer/capacitor, in some embodiments, the assignment of the logic values may be reversed to have a direct relationship with the amount of charge in the ferroelectric layer/capacitor.

Figure 5:
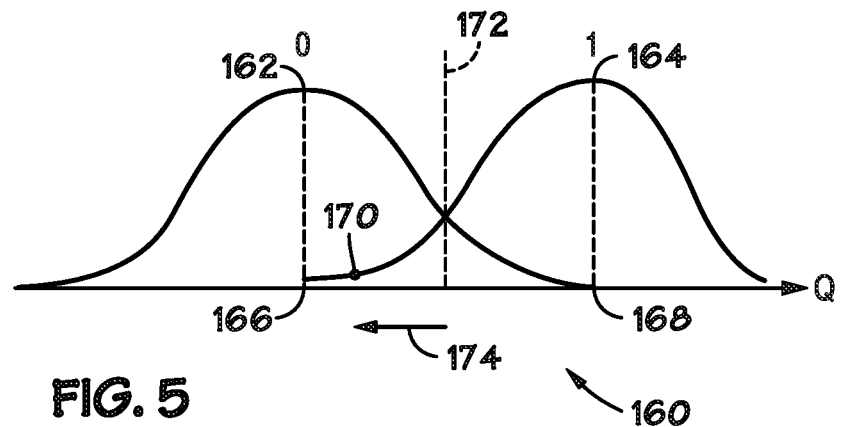
FIG. 5 is a graph of distributions of different logic levels for a one-transistor one-capacitor memory cell arrangement, according to an embodiment of the present disclosure.

As previously discussed, memory devices (e.g., FeRAM) may be implemented using 1T1C or 2T2C configurations. FIG. 5 shows a graph 160 showing distribution curves 162 and 164 reflecting possible charges for a "0" charge 166 and for a "1" charge 168 along respective Gaussian curves 162 and 164 for a 1T1C deployment. The memory device 10 may utilize a reference voltage 172 to interpret whether the charge is indicative of a "1" or a "0." However, as illustrated, there is a probability that a charge 170 along the curve 164 indicative of a "1" may be improperly interpreted as a "0" due to the amount of charge 170 being in a direction 174 (e.g., less than) relative to the reference voltage 172.

Figure 6:
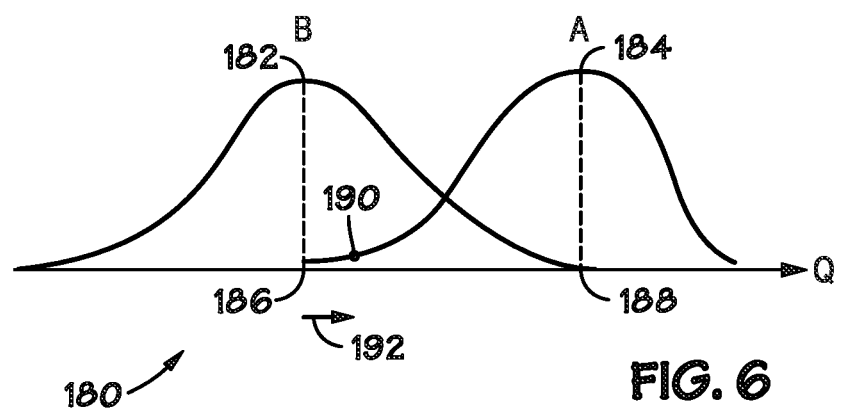
FIG. 6 is a graph of distributions of different charges for a two-transistor two-capacitor memory cell arrangement, according to an embodiment of the present disclosure.

As previously discussed, in addition or alternative to the 1T1C configuration, the memory device 10 may utilize a 2T2C configuration. FIG. 6 shows a graph 180 showing distribution curves 182 and 184 reflecting possible charges for a first charge 186 and for a second charge 188 along respective Gaussian curves 182 and 184 for a 2T2C deployment. Instead of using the reference voltage 172 to interpret whether the charge is indicative of a "1" or a "0," the charges may be subtracted from each other (e.g., A-B) to determine a differential signal. Thus, the probability that a charge 190 along the curve 184 may be improperly interpreted is reduced. The direction 192 from the first charge 186 is in the correct direction increasing the likelihood that the final result is interpreted properly.

In other words, 2T2C implementations provide a higher probability of a correct interpretation and provides faster speeds. However, the 2T2C implementation consumes more resources regarding financial costs, power costs, and area costs. The decision to use 1T1C and 2T2C may vary based on particular use cases.

Figure 7:
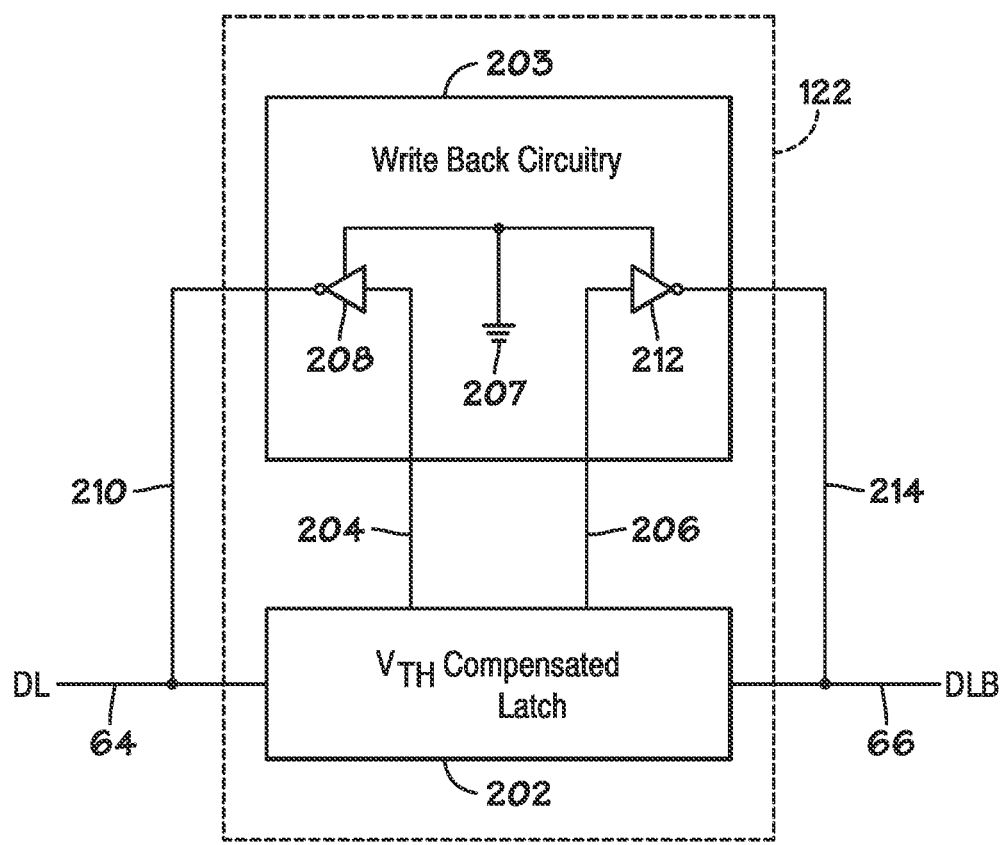
FIG. 7 is a block diagram of the embodiment of the sense amplifier of FIG. 3 with write back circuitry and a threshold voltage (VTH) compensated latch, according to an embodiment of the present disclosure.

FIG. 7 is a block diagram 200 of the sense amplifier 122 that includes a threshold voltage (VTH) compensated latch 202. The VTH compensated latch 202 compensates for mismatches in VTH between at least some transistors (e.g., PMOSes) of the VTH compensated latch 202 due to process, variation, or temperature (PVT) differences between those transistors. The VTH compensated latch 202 receives a differential signal using values from the twin cells via the DL 64 and the DLB 66. The VTH compensated latch 202 latches in value(s) based on the differential signal carried on the DL 64 and the DLB 66 (or a single-ended signal from only one digit line the case of 1T1C). The sense amplifier 122 amplifies the signal for interpretation. Furthermore, since the read operation for FeRAM is disruptive, the sense amplifier 122 repairs the values after the read. However, the sense amplifier 122 may operate at a lower voltage (e.g., <1.2 V) that is insufficient to write back to the DL 64 and/or the DLB 66 at a nominal voltage (e.g., 1.5 V). Thus, the VTH compensated latch 202 sends write back circuitry 203 signals, data 204 and 206 from gut nodes in the VTH compensated latch 202, which indicate the charges from the memory cells via the respective DL 64 and the DLB 66. The write back circuitry 203 provides a higher voltage supply 207 (e.g., 1.5 V) to an amplifier 208 amplify the write back value passed along line 210 to the DL 64. In some embodiments, the data 204 may be indicative of a charge of a memory cell sent via the DLB 66. Thus, in such embodiments, an amplifier 208 may be an inverting amplifier, as illustrated.

The write back circuitry 203 also provides the higher voltage supply 207 (e.g., 1.5 V) to an amplifier 212 to amplify the write back value passed along line 214 to the DLB 66. In some embodiments, the data 206 may be indicative of a charge of a memory cell sent via the DL 64. Thus, in such embodiments, an amplifier 212 may be an inverting amplifier, as illustrated.

Figure 8:
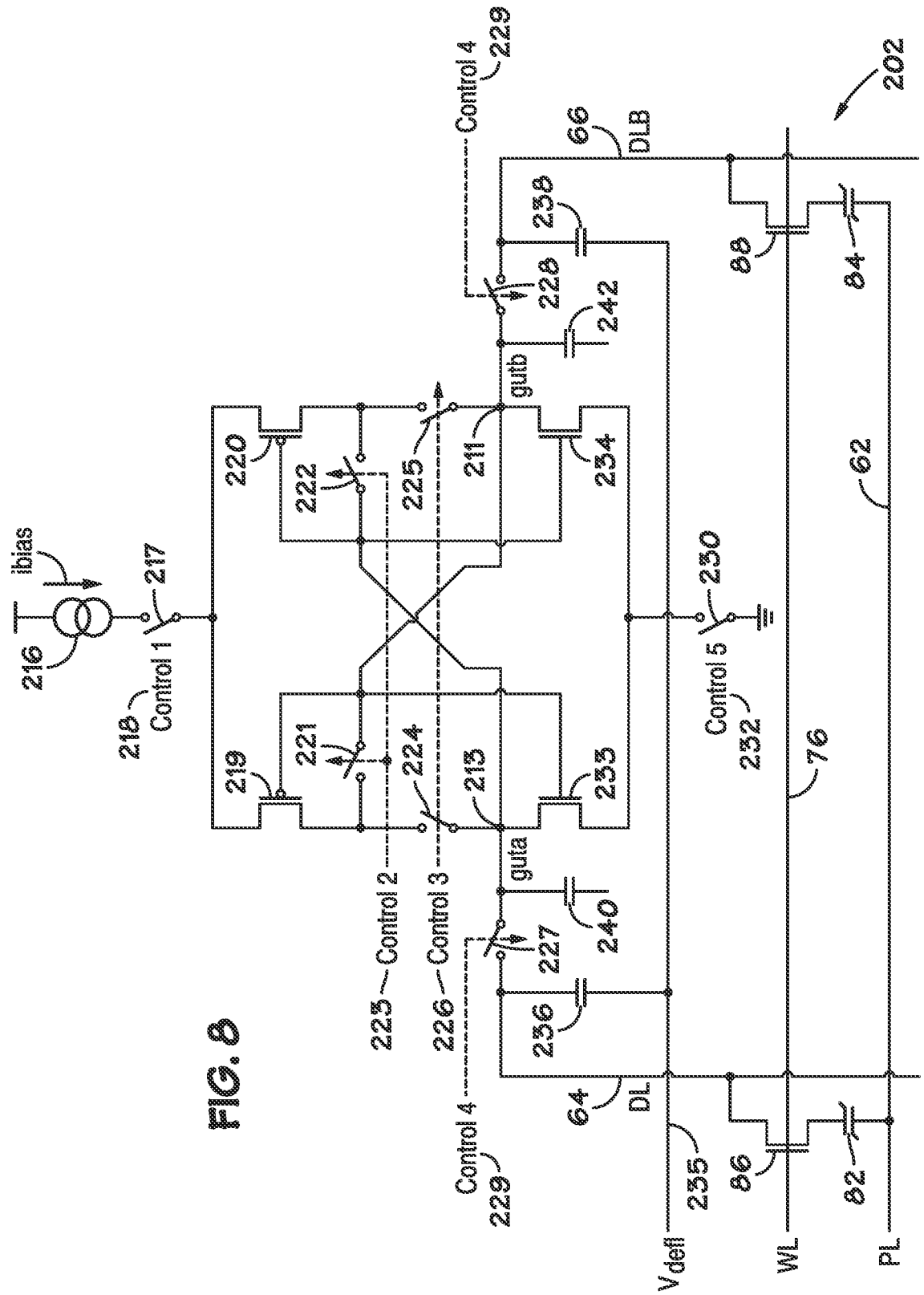
FIG. 8 is a circuit diagram of the VTH compensated latch of FIG. 7, according to an embodiment of the present disclosure.

FIG. 8 is a circuit diagram of the VTH compensated latch 202. The VTH compensated latch 202 includes a current source 216 that provides a bias current. The VTH compensated latch 202 also includes switch 217 that uses a control1 signal 218 to selectively couple the current source 216 to terminals (e.g., drain or source terminals) of PMOS transistors 219 and 220. The gate terminal of the PMOS transistor 219 is coupled to a gut node 211 of the VTH compensated latch 202, and the gate terminal of the PMOS transistor 220 is coupled to a gut node 213 of the VTH compensated latch 202. The other terminal (e.g., drain or source) of the PMOS transistor 219 is coupled to a switch 221, and the other terminal (e.g., drain or source) of the PMOS transistor 220 is coupled to a switch 222. The switches 221 and 222 are controlled by a control2 signal 223 that selectively couples the respective other terminals of the PMOS transistors 219 and 220 to their respective gate terminals.

The VTH compensated latch 202 further includes switches 224 and 225 controlled by a control3 signal 226. Based on the control3 signal 226, the switch 224 selectively couples the other terminal of the PMOS transistor 219 to the gut node 213. Similarly, based on the control3 signal 226, the switch 225 selectively couples the other terminal of the PMOS transistor 220 to the gut node 211.

The VTH compensated latch 202 also includes switches 227 and 228 that are controlled using a control4 signal 229. Based on the control4 signal 229, the switch 227 selectively couples the gut node 213 to the DL 64. Similarly, based on the control4 signal 229, the switch 228 selectively couples the gut node 211 to the DLB 66. In other words, the cotnrol4 signal 229 acts as an isolation signal that may be used to decouple the VTH compensated latch 202 from the DL 64 and the DLB 66.

The VTH compensated latch 202 further includes a switch 230 that utilizes a control5 signal 232 to selectively couple and decouple a terminal (e.g., drain) of NMOS transistors 233 and 234 to ground. A terminal of the NMOS transistor 233 is coupled to the gut node 213, and a terminal of the NMOS transistor 234 is coupled to the gut node 211. The gate of the NMOS transistor 233 is coupled to the gate of the PMOS transistor 219, and the gate of the NMOS transistor 234 is coupled to the gate of the PMOS transistor 220.

As discussed below, the VTH compensated latch 202 may apply a deflection voltage 235 that enables the VTH compensated latch 202 to help track the voltage difference in the memory cells by increasing the voltage difference between the DL 64 and the PL 62. The deflection voltage 235 may be applied to the DL 64 and the DLB 66 via capacitors 236 and 238. The capacitors may be MOSFET devices that are configured as capacitors.

Additionally, the VTH compensated latch 202 may include some capacitance on the lines coupled to the gut nodes 213 and 211 that are illustrated as capacitors 240 and 242. Although these capacitors 240 and 242 are shown as distinct capacitive devices, the capacitance may be parasitic capacitance of the lines connecting various components of the VTH compensated latch 202.

Although the switches 217, 221, 222, 224, 225, 227, 228, and 230 are illustrated as generic switches, they may be implemented with any suitable switch embodiment. For instance, for the purposes of the following discussion, the switches 217, 224, and 225 are implemented using PMOS transistors while the switches 221, 222, 227, 228, and 230 are implemented using NMOS transistors. However, other implementations for these switches may be used in other embodiments with the respective control signals changed accordingly.

FIG. 9 shows a graph 250 and a timing diagram 252 for utilizing the VTH compensated latch 202 across phases 254, 256, 258, and 260. The phase 254 is a VTH compensation phase where the respective VTHs of the PMOS transistors 219 and 220 are compensated for by turning on the switch 217 via the control1 signal 218 transitioning low to turn on the switch 217 (PMOS transistor) enabling the bias current to flow. The control2 signal 223 is also high during the phase 254 causing switches 221 and 222 to activate. The activation of the switches 221 and 222 (NMOS transistors) causes the PMOS transistors 219 and 220 to be configured in a diode configuration by coupling their respective gate terminals to their source/drain terminals. The control3 signal 226 is also high causing the switches 224 and 225 (PMOS transistors) to be off thereby decoupling the drains of the PMOS transistors 219 and 220 from the drains of the NMOS transistors 233 and 234. The control4 signal 229 is also high causing the switches 227 and 228 (NMOS transistors) to be on thereby respectively connecting the gut nodes 213 and 211 to the DL 64 and the DLB 66. This configuration causes any VTH differences for the PMOS transistors 219 and 220 to cause different charges to be stored on the DL 64 and the DLB 66.

Further, during phase 254, the WL 76 turns on. The WL 76 is represented in the graph 250 as a WL_near 76A for WLs near the WL driver and as WL_far 76B for WLs far from the WL driver of the memory device 10. The WL 76 may be turned on during the phase 254 to improve tRCD (i.e., time to open a row and access a column of memory cells). This early turn on anticipates the RC delays to the voltage evolution of the WL_far 76B. The PL 62 also remains off.

After the phase 254 and at the beginning of the phase 256, the control1 signal 218 is driven low, and the control2 signal 223 is driven low. The control1 signal 218 transitioning low causes the bias current to be cut off and the gut nodes 211 and 213 to be in a high impedance state. The change in the control2 signal 223 causes the PMOS transistors 219 and 220 to changed out of their diode configurations. Also during phase 256, the PL 62 transitions high, and the deflection voltage 235 is also issued to the VTH compensated latch 202. In some embodiments, as illustrated, the VTH compensated latch 202 may apply the deflection voltage 235 during the phase 254 while other embodiments apply the deflection voltage 235 during the phase 256.

After a delay 261 enabling the transition of the control2 signal 223 to complete, the control3 signal 226 is asserted (e.g., low for PMOS) causing the PMOS transistor 219 to be connected to the NMOS transistor 233 and the PMOS transistor 220 to be connected to the NMOS transistor 234.

During the phase 256, the connected memory cells are biased, and their charges are dumped on the DL 64 and the DLB 66 and a voltage is developed on the DL 64, the DLB 66, and the gut nodes 211 and 213, as shown in the graph 250.

Also, as illustrated in the timing diagram 252, the deflection voltage 235 is reduced during the phase 256 after time is given for the voltage difference between the gut nodes 211 and 213 to develop. This reduction of the deflection voltage 235 enables the overall voltage to be lowered for the gut nodes 211 and 213, the DL 64, and the DLB 66 without negatively impacting the voltage difference and fidelity of the output of the sense amplifier 122.

During the phase 258, the signal in the sense amplifier 122 is amplified by the PMOS transistors 219 and 220. Specifically, the control4 signal 229 is used to disconnect the DL 64 from the gut node 213 and disconnect the DLB 66 from the gut node 211. After a delay 262 enabling the control4 signal 229 to isolate the gut nodes 211 and 213, the control1 signal 218 is asserted to enable the PMOS amplification. In such a configuration, the PMOS transistors 219 and 220 amplify the signal on the gut nodes 211 and 213. Due to the VTH compensation, the error introduced in sensing may be lower than the small available signal on the gut nodes 211 and 213, and the voltage differences between the gut nodes 211 and 213 is increased.

In the phase 260, the control5 signal 232 is asserted thereby coupling the NMOS transistors 233 and 234 to ground. The inclusion of the NMOS transistors 233 and 234 completes the latch connection. In some embodiments, the NMOS transistors 233 and 234 do not undergo VTH compensation. In such embodiments, the connection of the NMOS transistors 233 and 234 may be delayed until there is a sufficient difference between the voltages of the gut nodes 211 and 213 making any NMOS offset insignificant/irrelevant.

The foregoing sense amplifier 122 acts on PMOS transistors 219 and 220. The VTH compensated latch 202 also acts by isolating the drains of the PMOS transistors 219 and 220 from the respective drains of the NMOS transistors 233 and 234. Furthermore, the DL 64 (and the DLB 66) auto-zero operating voltage is 0.0V rather than VCC/2 in some DRAM sense amplifiers allowing the VTH compensated latch 202 to operate at lower voltages.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A memory device, comprising:
   a plate line;
   a pair of ferroelectric layers implementing a pair of memory cells and coupled to opposite sides of the plate line;
   a pair of digit lines each coupled to a respective ferroelectric layer of the pair of ferroelectric layers; and
   a sense amplifier coupled to the pair of digit lines and configured to sense and amplify voltages received at the pair of digit lines from the respective memory cells, wherein the sense amplifier comprises a threshold voltage compensated latch that comprises:
      a plurality of p-channel transistors configured to compensate for process, voltage, or temperature variation mismatches between the threshold voltages of the plurality of p-channel transistors;
      a switch network comprising:
         a first pair of switches configured to selectively connect drain terminals of the plurality of p-channel transistors to respective gate terminals of the plurality of p-channel transistors in a threshold voltage compensation configuration; and
         a current switch that couples source terminals of the plurality of p-channel transistors to a current source during threshold voltage compensation using the threshold voltage compensation configuration, wherein the switch network is configured to disconnect each of the plurality of p-channel transistors from the current source and the pair of digit lines during at least one phase of the threshold voltage compensation.

2. The memory device of claim 1, wherein the switch network comprises a second pair of switches to couple gut nodes of the sense amplifier to respective digit lines of the pair of digit lines during the threshold voltage compensation.

3. The memory device of claim 2, wherein the threshold voltage compensation comprises charging to respective digit lines proportional to the threshold voltage of a corresponding p-channel transistor of the plurality of p-channel transistors.

4. The memory device of claim 3, comprising a pair of n-channel transistors each coupled to respective p-channel transistors of the plurality of p-channel transistors via a third pair of switches after the threshold voltage compensation, wherein the current switch and the first pair of switches are switched off to enable signal development in the sense amplifier.

5. The memory device of claim 4, wherein the current switch turns on current to the p-channel transistors and the second pair of switches turn off to isolate the gut nodes from the digit lines to amplify the voltages after a signal development stage has completed.

6. The memory device of claim 5, wherein the switch network comprises a latch switch that is configured to connect the n-channel transistors to latch values the amplified voltages after amplification has been performed.

7. The memory device of claim 1, comprising a capacitor to apply a deflection voltage to the sense amplifier during signal development.

8. The memory device of claim 1, wherein the memory cells store complementary data representing a single bit.

9. A memory device, comprising
   a plurality of ferroelectric layer-based memory cells to store data;
   a plurality of first digit lines each coupled to a respective ferroelectric layer-based memory cell of a first set of the plurality of ferroelectric layer-based memory cells;
   a plurality of second digit lines each coupled to a respective ferroelectric layer-based memory cell of a second set of the plurality of ferroelectric layer-based memory cells; and
   a plurality of sense amplifiers each coupled to a first digit line from the plurality of first digit lines and to a second digit line from the plurality of second digit lines and configured to sense and amplify a voltage difference between voltages on the first and second digit line, wherein each sense amplifier comprises a latch that comprises first and second p-channel transistors and is configured to compensate for process, voltage, or temperature variation mismatches between threshold voltages of the first and second p-channel transistors, wherein each respective latch comprises a switch network that comprises:
      a pair of diode-configuring switches configured to couple the respective first p-channel transistor as a first diode between a current source and the first digit line via a first isolation switch and to couple the respective second p-channel transistor as a second diode between the current source and the first digit line via a second isolation switch; and
      a current switch that couples source terminals of the first and second p-channel transistors to the current source, wherein each switch network is configured to disconnect each of the first and second p-channel transistors from the current source and respective digit lines of the plurality of first digit lines and the plurality of second digit lines during at least one phase of threshold voltage compensation.

10. The memory device of claim 9, wherein each of the first set of the plurality of ferroelectric layer-based memory cells store data, and each of the second set of the plurality of ferroelectric layer-based memory cells store complementary data.

11. The memory device of claim 10, wherein the first digit lines carry the data.

12. The memory device of claim 11, wherein the second digit lines carry a complement of the data.

13. The memory device of claim 9, comprising the current source that selectively supplies a current to the first and second p-channel transistors via the current switch.

14. The memory device of claim 9, comprising n-channel transistors and connection switches configured to couple the first and second p-channel transistors to respective gut nodes to amplify the voltage difference between the voltages carried on the first and second digit lines.

15. The memory device of claim 14, comprising a latch switch configured to connect the n-channel transistors to ground to implement a latch.

16. A method, comprising:
  connecting a first PMOS transistor in a sense amplifier in a diode configuration between a bias current and a first digit line to store a first charge that is proportional to a threshold voltage of the first PMOS transistor;
  connecting a second PMOS transistor in the sense amplifier in a diode configuration between the bias current and a second digit line to store a second charge that is proportional to a threshold voltage of the second PMOS transistor;
  disconnecting the first and second PMOS transistor from the bias current and cross-coupling the first and second PMOS transistor to enable the first and second charges to develop voltage levels from memory cells within the sense amplifier from the first and second digit lines; and
  disconnecting the cross-coupled first and second PMOS transistors from the first and second digit lines and amplifying their differences by connecting the first and second PMOS transistors in an amplifier configuration while the bias current remains disconnected from the first and second PMOS transistors.

17. The method of claim 16, comprising connecting a first NMOS transistor to the first PMOS transistor and a second NMOS transistor to the second PMOS transistor during the amplification of their differences.

18. The method of claim 17, comprising connecting the first and second NMOS transistors to ground to complete a latch in the sense amplifier.

19. The method of claim 16, comprising applying a deflection voltage to reduce voltages in the sense amplifier during voltage level development.

20. The method of claim 19, comprising applying the deflection voltage via capacitors coupled to the first and second digit lines.

* * * * *